United States Patent
Tosaya et al.

(10) Patent No.: US 9,496,154 B2
(45) Date of Patent: Nov. 15, 2016

(54) USE OF UNDERFILL TAPE IN MICROELECTRONIC COMPONENTS, AND MICROELECTRONIC COMPONENTS WITH CAVITIES COUPLED TO THROUGH-SUBSTRATE VIAS

(71) Applicant: Invensas Corporation, San Jose, CA (US)

(72) Inventors: Eric S. Tosaya, Fremont, CA (US); Rajesh Katkar, San Jose, CA (US); Liang Wang, Milpitas, CA (US); Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/488,187

(22) Filed: Sep. 16, 2014

(65) Prior Publication Data

US 2016/0079093 A1    Mar. 17, 2016

(51) Int. Cl.
| | |
|---|---|
| *H01L 21/00* | (2006.01) |
| *H01L 21/56* | (2006.01) |
| *H01L 23/00* | (2006.01) |
| *H01L 21/48* | (2006.01) |
| *H01L 23/31* | (2006.01) |
| *H01L 25/065* | (2006.01) |
| *H01L 25/00* | (2006.01) |

(52) U.S. Cl.
CPC ........... *H01L 21/563* (2013.01); *H01L 21/481* (2013.01); *H01L 23/3178* (2013.01); *H01L 24/83* (2013.01); *H01L 25/0657* (2013.01); *H01L 25/50* (2013.01); *H01L 2225/06513* (2013.01); *H01L 2225/06517* (2013.01); *H01L 2225/06541* (2013.01); *H01L 2924/14* (2013.01)

(58) Field of Classification Search
CPC ..... H01L 24/11; H01L 24/13; H01L 21/563; H01L 2224/32225
See application file for complete search history.

(56) References Cited

U.S. PATENT DOCUMENTS

| 5,386,087 A | 1/1995 | Lee et al. |
|---|---|---|
| 6,137,062 A | 10/2000 | Zimmerman |

(Continued)

FOREIGN PATENT DOCUMENTS

EP    1137066 A2    9/2001

OTHER PUBLICATIONS

Morita; Akira et al., "Wafer Spray Coating for Pre-Applied Underfill," product flyer by Nordson ASYMTEK dated Nov. 2012, 6 pages.

(Continued)

*Primary Examiner* — Whitney T Moore
*Assistant Examiner* — Joseph Galvin, III
(74) *Attorney, Agent, or Firm* — Haynes and Boone, LLP

(57) ABSTRACT

A microelectronic component (110, 120) has a contact pad (110C, 120C, 920C) recessed in a cavity (410) and covered by underfill tape (130). The cavity has a void (410V) below the underfill tape. A protruding contact pad of another microelectronic component ruptures the underfill tape to enter the cavity and bond to the recessed contact pad. The void helps in rupturing the underfill tape, thus reducing the amount of underfill residue between the two contact pads and improving the contact resistance. Also provided is a microelectronic component having a substrate with a cavity and having a through-substrate via extending into the cavity. Other features are also provided.

15 Claims, 7 Drawing Sheets

(56) References Cited

U.S. PATENT DOCUMENTS

| | | | |
|---|---|---|---|
| 6,157,076 | A | 12/2000 | Azotea et al. |
| 6,322,903 | B1 | 11/2001 | Siniaguine et al. |
| 6,717,254 | B2 | 4/2004 | Siniaguine |
| 6,773,958 | B1 | 8/2004 | Wang |
| 6,881,609 | B2 | 4/2005 | Salmon |
| 6,916,684 | B2 | 7/2005 | Stepniak et al. |
| 6,927,471 | B2 | 8/2005 | Salmon |
| 7,049,170 | B2 | 5/2006 | Savastiouk et al. |
| 7,115,988 | B1 | 10/2006 | Hool |
| 7,163,830 | B2 | 1/2007 | Salmon et al. |
| 7,254,024 | B2 | 8/2007 | Salmon |
| 7,297,572 | B2 | 11/2007 | Salmon |
| 7,408,258 | B2 | 8/2008 | Salmon |
| 7,427,809 | B2 | 9/2008 | Salmon |
| 7,505,862 | B2 | 3/2009 | Salmon |
| 7,586,747 | B2 | 9/2009 | Salmon |
| 8,071,470 | B2 | 12/2011 | Khor et al. |
| 8,106,518 | B2 | 1/2012 | Kawashita et al. |
| 8,202,797 | B2 | 6/2012 | Chi et al. |
| 8,618,659 | B2 | 12/2013 | Sato et al. |
| 2001/0026010 | A1* | 10/2001 | Horiuchi ............ H01L 21/561 257/678 |
| 2003/0134450 | A1* | 7/2003 | Lee .................... H01L 23/13 438/106 |
| 2003/0183951 | A1 | 10/2003 | Achari et al. |
| 2004/0092141 | A1* | 5/2004 | Salmon ............ H01L 21/6835 439/91 |
| 2005/0140026 | A1 | 6/2005 | Salmon |
| 2005/0212105 | A1 | 9/2005 | Walk |
| 2005/0255722 | A1 | 11/2005 | Salmon |
| 2005/0263869 | A1 | 12/2005 | Tanaka et al. |
| 2007/0007983 | A1 | 1/2007 | Salmon |
| 2007/0023889 | A1 | 2/2007 | Salmon |
| 2007/0023923 | A1 | 2/2007 | Salmon |
| 2007/0178232 | A1* | 8/2007 | Kodas ................ H05K 3/046 427/180 |
| 2007/0235850 | A1 | 10/2007 | Gerber et al. |
| 2009/0108472 | A1 | 4/2009 | Feger et al. |
| 2010/0047969 | A1 | 2/2010 | Kim et al. |
| 2010/0059897 | A1* | 3/2010 | Fay .................... H01L 24/03 257/777 |
| 2010/0276799 | A1 | 11/2010 | Heng et al. |
| 2011/0027967 | A1 | 2/2011 | Beyne et al. |
| 2011/0186998 | A1 | 8/2011 | Wu et al. |
| 2011/0215464 | A1* | 9/2011 | Guzek ............... H01L 21/568 257/737 |
| 2011/0233762 | A1* | 9/2011 | Gruber ............... H01L 21/486 257/737 |
| 2011/0237028 | A1 | 9/2011 | Hamazaki et al. |
| 2012/0091583 | A1 | 4/2012 | Kawashita et al. |
| 2012/0106228 | A1 | 5/2012 | Lee |
| 2012/0276733 | A1 | 11/2012 | Saeki et al. |
| 2012/0295415 | A1 | 11/2012 | Ono |
| 2013/0087917 | A1 | 4/2013 | Jee et al. |
| 2013/0119528 | A1 | 5/2013 | Groothuis et al. |
| 2013/0146991 | A1 | 6/2013 | Otremba et al. |
| 2013/0196472 | A1 | 8/2013 | Hoang et al. |
| 2013/0214431 | A1 | 8/2013 | Lin et al. |
| 2013/0241026 | A1 | 9/2013 | Or-Bach et al. |
| 2013/0267046 | A1 | 10/2013 | Or-Bach et al. |
| 2013/0270699 | A1 | 10/2013 | Kuo et al. |
| 2013/0292840 | A1 | 11/2013 | Shoemaker et al. |
| 2014/0036454 | A1 | 2/2014 | Caskey et al. |
| 2014/0111269 | A1 | 4/2014 | Huang |
| 2014/0239507 | A1* | 8/2014 | Hsiao ................. H01L 25/50 257/774 |

OTHER PUBLICATIONS

U.S. Appl. No. 13/924,002, filed Jun. 21, 2013 entitled, "Reliable Device Assembly," by Haba et al.

R.H. Esser, et. al., Improved Low-Temperature Si Si Hydrophilic Wafer Bonding, J. Electrochem. Soc. 2003 150(3): G228-G231.

Freescale, "Flip Chip Plastic Ball Grid Array (FC-PBGA)," Application Note, Q2 2012, 55 pages.

Gosele; U. et al., "History and Future of Semiconductor Wafer Bonding," Solid State Phenomena vols. 47-48 (1996) pp. 33-44.

I-Micronews, "Advanced Packaging: Underfilling in the era of high density / 3D interconnect: a closer look," online news article dated Jan. 3, 2012, 5 pages, retrieved 8/15/14. http://www.i-micronews.com/news/Underfilling-era-high-density-3D-interconnect-closer-look,8105.html[Aug. 15, 2014 9:07:22 AM].

Liang; Di et al., "Low-Temperature, Strong SiO2-SiO2 Covalent Wafer Bonding for III-V Compound Semiconductors-to-Silicon Photonic Integrated Circuits," Journal of Electronic Materials, DOI: 10.1007/s11664-008-0489-1, May 9, 2008, 8 pages.

W. P. Maszara, Silicon-On-Insulator by Wafer Bonding: A Review, J. Electrochem. Soc. 1991138(1): 341-347.

Gotro, Jeffrey, "Polymer Challenges in Electronic Packaging: Part 4 Wafer Level Underfills," Polymer Innovation Blog, Oct. 28, 2013, 4 pages.

IP Strategy, "Benefits of Copper Pillar Well (CPW) Technology," Technology/IP Preview, 2006, 4 pages.

Cook; Kathy et al., "TSV Processing and Wafer Stacking," SUSS MicroTec, retrieved Sep. 16, 2014, 36 pages.

Takagi; Hideki et al., "Low Temperature Direct Bonding of Silicon and Silicon Dioxide by the Surface Activation Method," 1997 International Conference on Solid-State Sensors and Actuators Chicago, Jun. 16-19, 1997, pp. 657-660.

Gilleo; Dr. Ken et al., The Great Underfill Race retrieved Sep. 16, 2014, 6 pages.

Schmidt; Martin A., "Wafer-to-Wafer Bonding for Microstructure Formation," Invited Paper, Proceedings of the IEEE, vol. 86, No. 8, Aug. 1998, 11 pages.

Johnson; Wayne et al., "Wafer Applied Underfills for Flip Chip Assembly," retrieved Sep. 16, 2014, 11 pages.

Zoschke; K. et al., "Polyimide Based Temporary Wafer Bonding Technology for High Temperature Compliant TSV Backside Processing and Thin Device Handling," SUSS MicroTec, Published in the SUSS report Feb. 2012, 11 pages.

InvensasTM White Paper, "High Performance BVA PoP package for Mobile Systems," May 2013 by Invensas Corporation of San Jose, CA.

International Search Report and Written Opinion issued in PCT Application PCT/US2015/050374 on Jan. 4, 2016.

* cited by examiner

USE OF UNDERFILL TAPE IN MICROELECTRONIC COMPONENTS, AND MICROELECTRONIC COMPONENTS WITH CAVITIES COUPLED TO THROUGH-SUBSTRATE VIAS

BACKGROUND OF THE INVENTION

The present invention relates to microelectronics, and more particularly to assembling microelectronic components.

Microelectronic components have miniature circuits with features too small to be handled by humans. Examples of such components are semiconductor integrated circuits (ICs 110 in FIG. 1), interconnection substrates (e.g. 120), and their combinations (component 122 of FIG. 1 is a combination of components 110 and 120). Substrate 120 provides interconnections between different ICs 110 and/or between the ICs and other microelectronic components and other circuits. Examples of interconnection substrates are printed circuit boards (PCBs) and interposers; an interposer is an intermediate interconnection substrate, with other microelectronic components attached both to the top and the bottom of the interposer. In the example of FIG. 1, contact pads 110C of two ICs 110 are attached to contact pads 120C of substrate 120. Substrate 120 has interconnect lines 150 which interconnect the contact pads 120C in a desired pattern. The attachments of contact pads 110C to contact pads 120C are shown at 140; these can be solder, adhesive, or thermocompression attachments (in thermocompression, the contact pads are attached without solder, adhesive, or any other bonding agent). Contact pads 110C could also be connected to contact pads 120C by discrete wires, but discrete wires undesirably increase the size of the assembly and the length of the connections. Short lengths are preferred to reduce power consumption and parasitic capacitances and inductances and to increase the operating speed.

Each IC 110 and substrate 120 may include densely packed circuits with hundreds or thousands of contact pads 110C and 120C per square inch or square centimeter. Therefore, the contact pads and the connections 140 must be small. However, small connections can easily brake due to stresses arising from thermal expansion and contraction. In order to strengthen the connections 140, the surrounding spaces are filled with underfill (UF) 130. Underfill 130 is an adhesive that glues the components 110 to components 120 and thus relieves some of the stress on connections 140.

In older technologies still in use today, the underfill 130 is introduced after attachment of ICs 110 to substrate 120; the underfill is introduced in liquid form at the IC periphery, and is drawn to the IC underside by capillary forces. Then the underfill is cured to solid state. Hopefully, the underfill will have no voids. However, the capillary process and the subsequent curing take much time, and place stringent requirements on the underfill material and the process conditions, especially if the IC 110 is large. Void-free capillary underfilling can be a demanding procedure.

Another option is pre-applied underfills, i.e. the underfills applied before attaching ICs 110 to substrate 120. FIG. 2A shows liquid (viscous but flowing) underfill 130 pre-applied on IC 110 or substrate 120 and squeezed as the IC is being placed on the substrate. Contact pads 120C have been "bumped" with solder 140 before the underfill process. FIG. 2B shows the IC's contact pads 110C and 120C being joined by solder connections 140. At this stage, the solder is reflowed (melted) to bond the contact pads 110C to contact pads 120C, and underfill 130 is cured.

This process requires strict control of the underfill deposition: if the UF layer is too thick, then voids (bubbles) are likely to form in the underfill. Also, undesirably, any excess of the pre-applied underfill flows out from under the IC and may affect adjacent circuitry.

Another type of pre-applied underfill is non-conductive film (NCF), applied to either IC 110 (as in FIG. 3A) or to substrate 120 in liquid form and partially cured before attachment of components 110, 120 to each other. Alternatively, NCF can be applied in dry (solid) form, e.g. by a heat roller; the heat makes NCF to flow slightly during application and to cover the IC 110 without voids.

In the example of FIG. 3B, IC 110 with NCF 130 is attached to the substrate 120. This process is conducted at an elevated temperature and a sufficient pressure (illustrated by the force F) to soften NCF 130 so that the contact pads 110C and 120C penetrate the NCF and bond together (e.g. by thermocompression, or by solder, not shown; the solder can be formed on contact pads 110C before they are covered by the NCF).

A major challenge in this process is to provide low contact resistance, i.e. low electrical resistance at the juncture 350 of contact pads 110C and 120C. Since NCF is dielectric, and the juncture area 350 is small, even minute NCF residue in the area 350 can significantly lower electrical conductivity. If the IC has hundreds or thousands of contact pads 110C, even a single bad connection (between a single pair of contact pads 110C and 120C) can make the assembly inoperable. Therefore, it has been proposed to arrange the NCF so that the contact pads 110C are exposed before the attachment of IC 130 to substrate 120 (as in FIG. 3C). See U.S. pre-grant patent application no. 2011/0237028 (Hamazaki et al., Sep. 29, 2011), and U.S. Pat. No. 6,916,684 (Stepniak et al., Jul. 12, 2005).

SUMMARY

This section summarizes some features of the invention. Other features may be described in the subsequent sections. The invention is defined by the appended claims, which are incorporated into this section by reference.

Some embodiments of the present invention do not require contact pad exposure as in FIG. 3C. However, the NCF and the contact pads are architectured for more reliable NCF penetration during the component-to-component attachment. More particularly, in some embodiments, one of the contact pads protrudes out, and the other contact pad is recessed in a cavity. For example, in FIG. 4A, contact pad 110C protrudes out, and contact pad 120C is recessed in a cavity 410 in substrate 120 (the drawings are not necessarily to scale, with exaggerations meant to clarify pertinent technological features). Further, NCF 130 is a dry tape or a combination of dry and liquid layers, so that the NCF covers the cavity 410 without filling the cavity. The cavity has a void 410V under the NCF tape. When the IC 110 is placed on component 120 (FIG. 4B), the NCF is pushed into the void 410V by protruding contact pad 110C (due to applied force F). Consequently, the NCF is stretched out, and becomes thinner under the contact pad 110C. The NCF can be ruptured or at least partially penetrated by contact pad 110C before reaching the contact pad 120C. Even if the NCF does not rupture at this stage, NCF thinning makes it easier for the two contact pads to pierce the NCF and reliably bond together (FIG. 4C).

Since the NCF penetration is more reliable due to the void, the force F can be reduced to lessen the risk of damage to components 110 and 120. Further, the force F can be set less precisely, i.e. can be allowed to vary in a greater range, while still providing reliable contact pad bonding.

In other embodiments, the NCF tape is pre-patterned (e.g. by laser, stamping, photolithography, or some other techniques) before the component attachment.

In some embodiments, after the contact pad bonding, application of vacuum and pressure (force F) at or below the bonding temperature induces a portion of the NCF layer to fill the cavity 410 and provide a planar top surface as in FIG. 4C.

The cavity can be partially filled by solder or adhesive before attachment of contact pads 110C to 120C, leaving the void 410V between the solder or adhesive and the NCF. The void allows the solder or adhesive to expand during the attachment, and also provides room for the softened NCF to expand and flow into the cavity at elevated temperatures during the attachment. Therefore, the void allows relaxed control of many parameters such as dimensions of the contact pads and the cavity; NCF thickness; temperatures during manufacturing and subsequent operation; and the compositions of various materials including the NCF and the solder or adhesive.

Some aspects of the invention pertain to through-substrate vias (TSVs) protruding into cavities; for example, the recessed contact pad 120C can be provided by a TSV protruding into the cavity. The cavity can be partially filled with solder or adhesive.

The invention is not limited to the features and advantages described above except as defined by the appended claims.

DESCRIPTION OF SOME EMBODIMENTS

The embodiments described in this section illustrate but do not limit the invention. The invention is defined by the appended claims.

Components 110, 120, and other microelectronic components described below can be any microelectronic components, not necessarily an IC or an interconnect substrate, unless the context clearly indicates otherwise. For example, one or both of components 110 and 120 can be an assembly of multiple ICs and/or interconnect substrates. The terms "IC" and "substrate" are used for illustration and not to limit the invention.

Figure 4A:
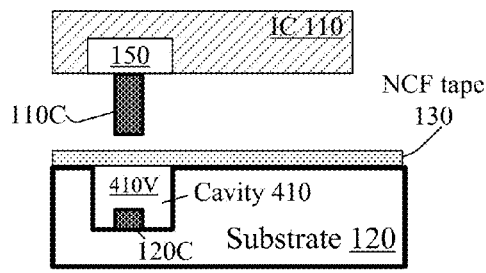
FIGS. 4A, 4B, 4C, 5, 6A, 6B, 7A are vertical cross sectional views of microelectronic components at different stages of fabrication according to some embodiments of the present invention.

As shown in FIG. 4A, contact pads 110C can be connected to circuitry 150 in component 110. Circuitry 150 may include conductive lines (including possibly vias extending through component 110 to provide a contact pad (not shown) on top of the component), transistors, resistors, capacitors, inductors, and/or other circuit elements. Likewise, contact pad 120C can be connected to such circuitry (not shown) in component 120. Circuitry 150 is omitted from some or all of subsequent drawings.

The terms "top" and "bottom" are for ease of description; the components and other elements can be turned upside down or at any angle during fabrication and subsequent operation.

Further, any one of contact pads 110C, 120C can be protruding, with the other contact pad being recessed.

Suitable NCF tape materials include polymeric tapes, including dielectric organic polymers, possibly with fillers. An example is partially cured (B-stage) epoxy with a silica filler. Suitable materials are described in the aforementioned U.S. pre-grant patent application no. 2011/0237028 (Hamazaki et al., Sep. 29, 2011), and U.S. Pat. No. 6,916,684 (Stepniak et al., Jul. 12, 2005).

Further, the NCF tape can be a multi-layer structure, with one or more layers made of the materials described above, with possible additional solid or non-solid layers.

The contact pad materials can be as in prior art. The contact pads may include outer layers of solder or conductive or anisotropic adhesive, or they can be bonded together without solder or adhesive, by thermocompression for example. The solder or adhesive, is present, are sometimes described as separate layers in the discussion below, but sometimes are referred to as parts of the contact pads.

Solder or adhesive can be pre-deposited on contact pad 110C before the component-to-component attachment. Alternatively or in addition, the solder or adhesive can be pre-deposited on contact pad 120C either before application of NCF 130 on component 120, or after NCF application (if, for example, the NCF tape is pre-patterned before the component attachment).

Figure 4B:
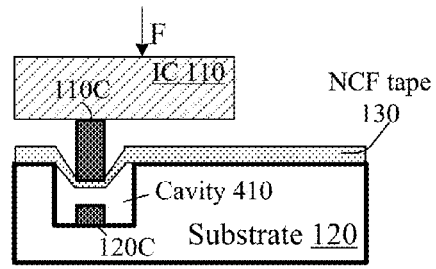
Figure 4C:
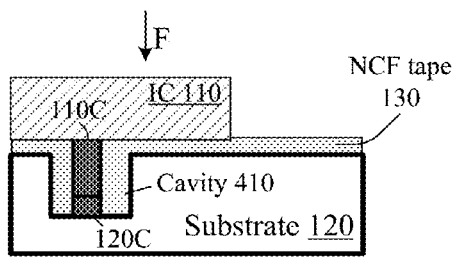

In some embodiments, the operation of FIG. 4C (joining of the components 110 and 120) starts at a lower temperature, when the NCF tape 130 is easier to rupture (the NCF fracture strength is lower). When the contact pad 110C is deep inside the cavity 410, the temperature is increased; by this time the NCF tape may have been ruptured and the two contact pads are in a position, or almost in a position, in which they can be bonded together (by thermocompression, solder (not shown), conductive or anisotropic adhesive (not shown), or some other means). For example, when the contact pad 110C is deep inside the cavity, the two contact pads may touch or almost touch each other, or they may touch or almost touch a bonding agent such as solder or adhesive. Increasing the temperature at this stage may soften the NCF (depending on the NCF material) and thus help remove any NCF residue from between the contact pads. Increased temperature may also be required to bond the contact pads together.

In addition, increased temperature may cause at least part of NCF to flow and fill the cavity 410; filling the cavity may be desirable in some embodiments to eliminate air or other gas that could otherwise be trapped inside the cavity and corrode the contact pads. However, it may be desirable not to fill the cavity completely in order to provide room for thermal expansion of solder or other materials during solder reflow performed in attaching the contact pads 110C to 120C or for other high temperature operations.

Figure 1:
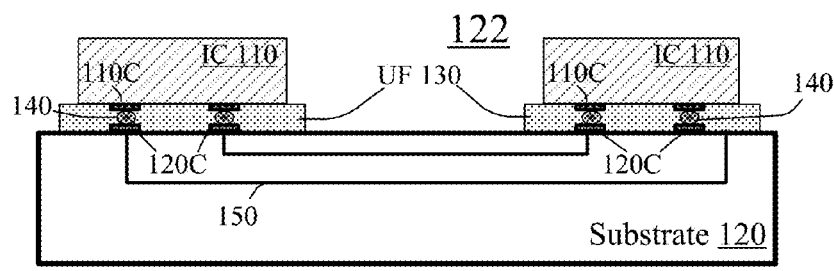
FIGS. 1, 2A, 2B, 3A, 3B, 3C are vertical cross sectional views of microelectronic components at different stages of fabrication according to prior art.
Figure 2A:
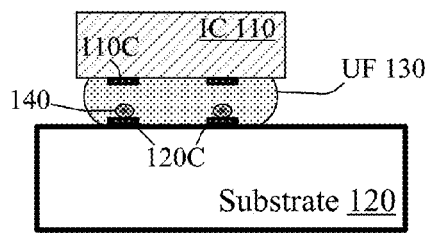
Figure 2B:
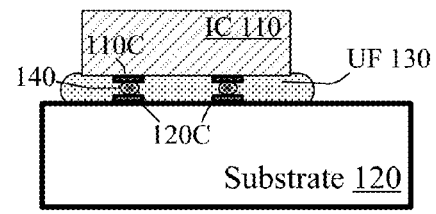
Figure 3A:
Figure 3B:
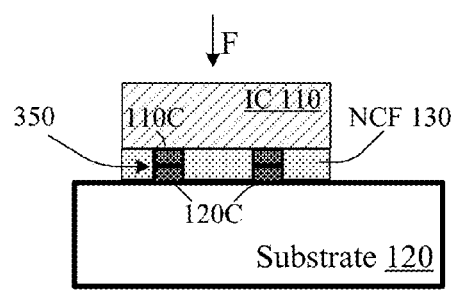
Figure 3C:
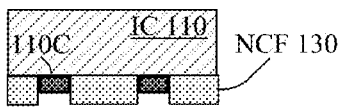
Figure 5:
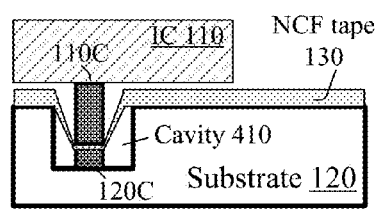

As shown in FIG. 5, in some embodiments, the protruding contact pad 110C does not rupture the NCF tape even when the NCF tape contacts the recessed pad 120C. Alternatively, the NCF tape can be ruptured incompletely, with some NCF residue remaining between the contact pads. Additional removal of the NCF residue is performed when NCF is pressed against the recessed contact pad 120C, similarly to FIG. 3B. However, due to cavity 410V, the NCF tape is stretched and thinned and hence easier to rupture; NCF residue removal is therefore more complete.

Figure 6A:
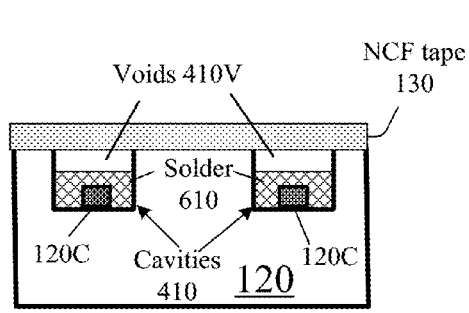
Figure 6B:
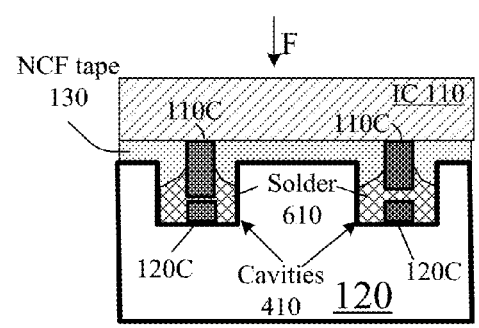

As shown in FIG. 6A, solder or adhesive 610 can be deposited into cavity 410 before application of NCF 130. Solder or adhesive 610 may fill the cavity to a level above the contact pad 120C, but does not fill the cavity completely, leaving a void 410V under the NCF tape. A reliable bond (FIG. 6B) between contact pads 110C and 120C can be achieved even if the contact pad 110C does not reach the contact pad 120C, as long as the contact pad 110C reaches the solder or adhesive 610. Therefore, this architecture is tolerant to variations in the size of contact pads 110C, the depth of cavity 410, the amount of solder or adhesive 610, and the compressive force F applied during the attachment. This tolerance is particularly desirable if the components 110, 120 have multiple contact pads 110C, 120C (possibly hundreds or thousands) bonded together in the same attachment operation, especially if it is difficult to ensure high uniformity of the contact pad and cavity sizes and of the solder or adhesive amounts in each cavity. Note U.S. Pat. No. 7,049,170 (Savastiouk et al., May 23, 2006), incorporated herein by reference, discussing the importance of such tolerance.

Figure 7A:
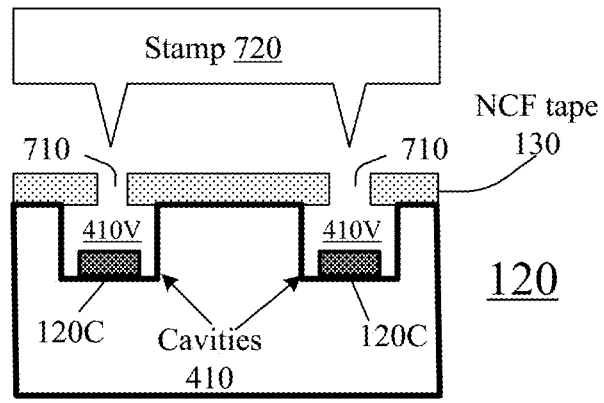
Figure 7B:
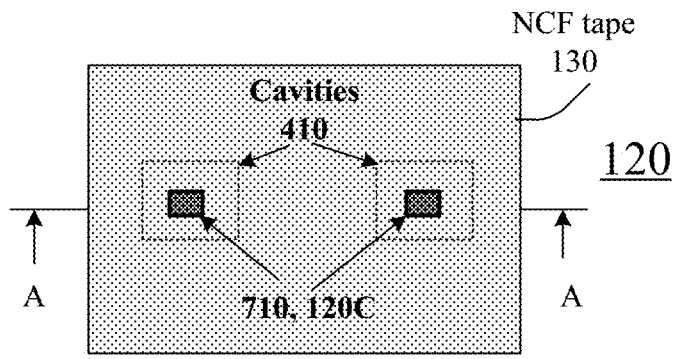
FIG. 7B is a top view of a microelectronic component according to some embodiments of the present invention.

As noted above, NCF tape 130 can be pre-patterned; FIGS. 7A, 7B show holes 710 formed in NCF 130 at the location of cavities 410 before the component-to-component attachment. FIG. 7B is a top view of pre-patterned NCF on component 120, and FIG. 7A shows a vertical cross-section of the component 120 along a vertical plane A-A of FIG. 7B. The holes 710 can be made by stamping (using for example a stamp 720 made of steel or polymer (e.g. PDMS) or some other material), or by laser, or photolithographically, or in some other way. Some photolithographic embodiments use photoimageable NCF 130, or a multi-layer NCF having a top photoimageable layer. Examples of photoimageable underfill materials are certain types of organic polymers such as polyimides and benzocyclobutene (BCB) based polymers available from DuPont, Fujifilm, and other manufactures. Alternatively, a separate photoresist layer can be used on top of NCF 130, and can be removed after the NCF is patterned and before the component-to-component attachment.

The holes 710 can be smaller in lateral dimension (in top view) than the cavities 410 or pads 120C or 110C. During the component attachment, protruding contact pads 110C enlarge the holes, facilitating a reliable contact bond. Therefore, the NCF tape can be stretched by smaller amount during bonding. Hence, the cavity depth can be reduced (the cavity depth, or rather the depth of void 410V, defines the maximum strain of the NCF tape). Shallower cavities can be formed faster and more reliably. Also, contacts 110C may be allowed to have shorter protrusions, and thus to be mechanically stronger, resulting in improved reliability and manufacturing yield.

In addition, the compressive force F can be reduced, and there is more tolerance to variations in the force F, the cavity depth, and possibly other parameters (e.g. NCF composition).

Figure 8:
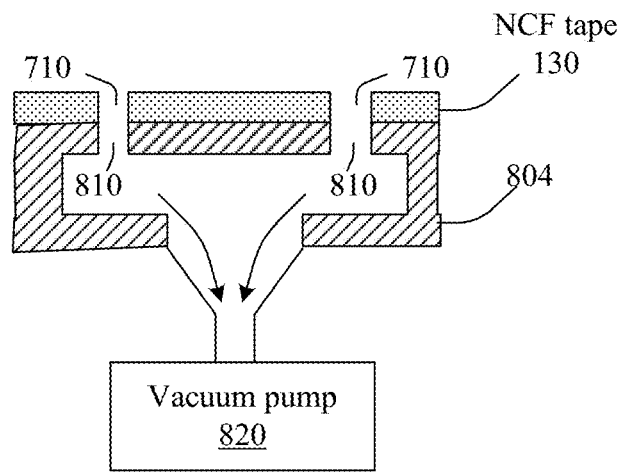
FIGS. 8, 9A, 9B, 10A, 10B, 11, 12A, 12B, 12C, 12D, 13A, 13B, 13C, 13D, 13E, 13F, 14A, 14B, 15, 16 are vertical cross sectional views of microelectronic components at different stages of fabrication according to some embodiments of the present invention.

NCF tape 130 can be pre-patterned before its application to component 120. In FIG. 8, NCF tape 130 is placed on vacuum stage 804 having holes 810 that match the positions of cavities 410. Vacuum pump 820 creates vacuum under holes 810. NCF tape is ruptured at each hole 810, to form the corresponding hole 710. The NCF can be ruptured by the vacuum force, and/or a stamp (such as 720 shown in FIG. 7A). If desired, NCF tape 130 may include a liner on the bottom to allow the NCF tape to be easily detachable from the vacuum stage after the pre-patterning process. The patterned NCF tape is then placed on component 120 as in FIG. 7A.

Other methods can be used to per-pattern NCF 130 before applying the NCF to component 120. For example, the NCF can be pre-patterned by laser or photolithographically.

The techniques described above are compatible with wafer level underfill (WUF or WLUF). More particularly, in known processes, multiple ICs or stacks of ICs are fabricated in a single wafer or a stack of wafers, and the wafer or stack is then diced to separate the ICs or IC stacks. In known WUF processes, NCF is applied on top of a wafer and is diced together with the wafer; dicing forms individual ICs with the NCF already on top of each IC. See U.S. pre-grant patent application no. 2009/0108472 (Feger et al., Apr. 30, 2009), and Underfilling in the era of high density/3D interconnect: a closer look, I-Micronews, Jan. 3, 2012, both incorporated herein by reference.

In WUF processes according to some embodiments of the present invention, NCF tape 130 is applied on a wafer (on the top wafer of a stack if there is a stack), and NCF tape 130 is diced together with the wafer or stack; the dicing forms individual components 120 with the NCF tape on each component. NCF can be pre-patterned before or after application to the wafer or stack (as in FIG. 7A or 8), before or after dicing.

Figure 9A:
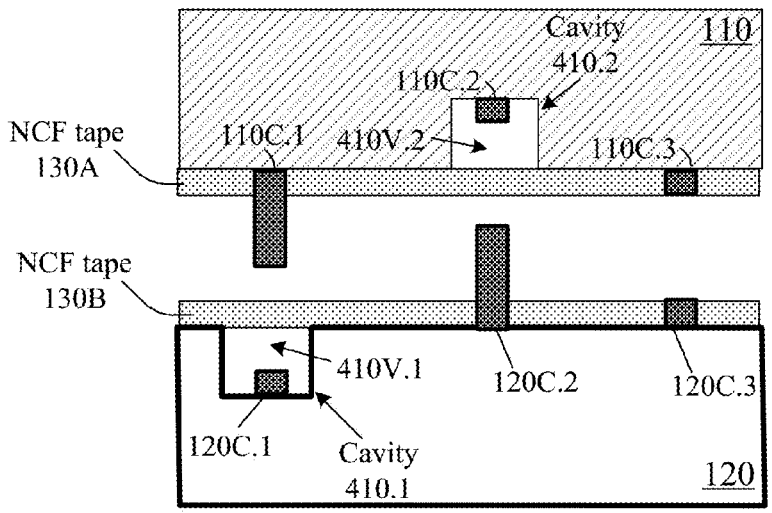
Figure 9B:
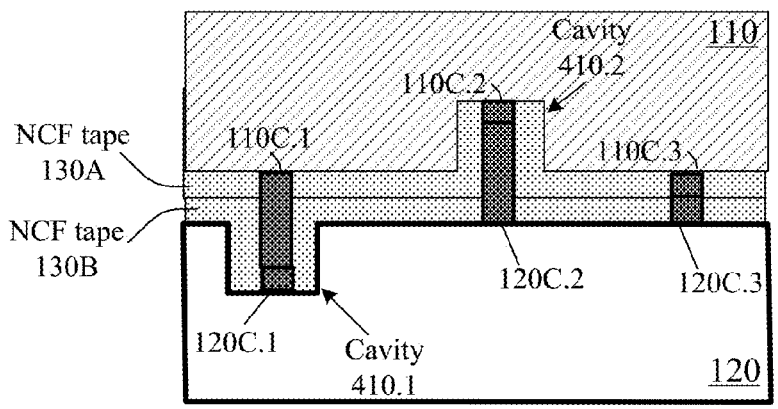

FIGS. 9A and 9B illustrate that the same component may have protruding, recessed, and other types of contact pads. FIG. 9A illustrates the components 110 and 120 before they are attached together; FIG. 9B illustrates the components after attachment. Component 110 has a protruding contact pad 110C.1, a recessed contact pad 110C.2 in cavity 410.2, and another contact pad 110C.3. Component 120 has respective matching contact pads 120C.1 (recessed in cavity 410.1), 120C.2 (protruding), and 120C.3. NCF tape 130A has been applied to component 110 to cover the cavity 410.2, leaving a void 410V.2 in the cavity. NCF 130A does not cover contact pads 110C.1 and 110C.3. Component 120 has NCF tape 130B covering the cavity 410.1, leaving a void 410V.1 in the cavity. NCF 130B does not cover contact pads 120C.2 and 120C.3. During component attachment (FIG. 9B), contact pad 110C.1 pierces NCF tape 130B, and contact pad 120C.2 pierces NCF tape 130A, to bond to the corresponding contact pads 120C.1 and 110C.2. In other embodiments contact pads 110C.3 and/or 120C.3 can be covered by respective underfill 130A or 130B before attachment, and can be joined together by displacing the underfill as in prior art. Other combinations of the features described above are also possible.

Protruding and recessed contact pads can be formed by many techniques, including prior art techniques. For example, to form a protruding contact pad, one can first form a contact pad of any geometry, and then augment the contact pad with a protruding solder bump or a copper post or some other type of protruding conductor. In some embodiments, protruding contact pads are formed as copper posts (e.g. by electroplating a copper layer using a suitable mask); or as wires bonded to a component. Exemplary protruding wires are BVA wires described in Invensas™ High Performance BVA PoP package for Mobile Systems, May 2013 by Invensas Corporation of San Jose, Calif., incorporated herein by reference; see also U.S. Pat. No. 8,618,659 issued Dec. 31, 2013 to Sato et al., incorporated herein by reference; and U.S. pre-grant patent publication 2014/0036454 by Caskey et al., published Feb. 6, 2014, incorporated herein by reference. Another possible technique is, before forming a contact pad, form a protruding dielectric bump at the contact pad's location (e.g. a polymer bump, not shown), and then form a conductive line overlying the bump so as to provide the contact pad over the bump; the conductive line extends from the contact to connect the contact pad to other circuitry such as 150 in FIG. 4A; see U.S. Pat. No. 6,322,903 issued Nov. 27, 2001 to Siniaguine et al. and incorporated herein by reference. Alternatively, the bump may have a hole made therein to extend to circuitry 150, and the contact pad can fill the hole and connect to circuitry 150 in the hole. These are just some non-limiting examples.

Figure 10A:
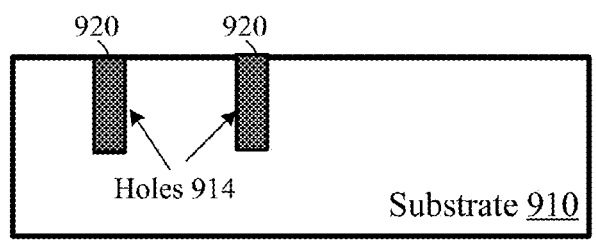
Figure 10B:
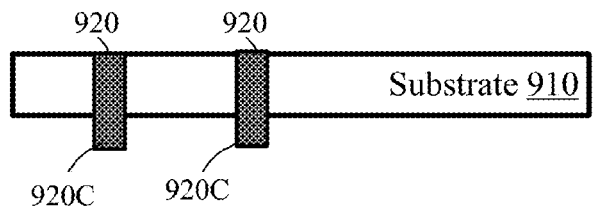

Protruding contact pads can also be formed using technology related to through-substrate vias (TSVs); see the aforementioned U.S. Pat. No. 7,049,170. In an exemplary embodiment, a substrate 910 (FIG. 10A) is processed to include blind holes 914 filled with conductor 920. Holes 914 are called blind because they do not go through substrate 910. Conductive vias 920 can be connected to other circuitry (not shown, such as 150 in FIG. 4A) formed in or above the substrate. The substrate can be silicon, glass, or other materials. Then the substrate is thinned from the bottom (FIG. 10B), possibly by a blanket etch. Vias 920 become exposed and protrude on the bottom, forming the protruding contact pads shown as 920C. Additional circuitry can be formed on the bottom if desired.

Figure 11:
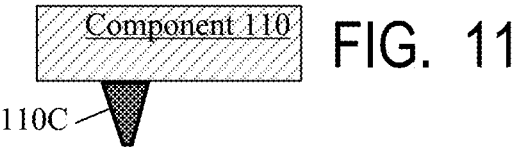

Protruding contact pads can have sharp tips to facilitate rupture of NCF 130. For example, a conical or pyramidal shape can be provided, as in FIG. 11 for contact pad 110C. Such shapes can be formed by suitable photolithography, e.g. by image reversal photoresist or other techniques; see e.g. U.S. pre-grant patent publication 2013/0270699 (Kuo et al., Oct. 17, 2013), incorporated herein by reference. In TSV variations, such shapes can be formed by suitable shaping of holes 914.

Recessed contact pads can also be formed by known techniques, e.g. forming a contact pad of any geometry, then forming a dielectric layer over the contact pad (possibly with a dielectric with a planar top surface throughout the component), and photolithographically patterning the dielectric layer to form a cavity 410 exposing the contact pad. In some embodiments (e.g. contact pad 120C in FIG. 4B), the recessed contact pad protrudes out of the cavity bottom. The protrusion can be formed by the techniques described above; for example, the recessed contact pad can first be formed as a protruding contact pad; then a dielectric layer can be deposited to cover the protruding contact pad; then a cavity can be etched in the dielectric to expose the top surface and sidewalls of the contact pad; the contact pad is now recessed in the cavity but protrudes from the cavity bottom.

Figure 12A:
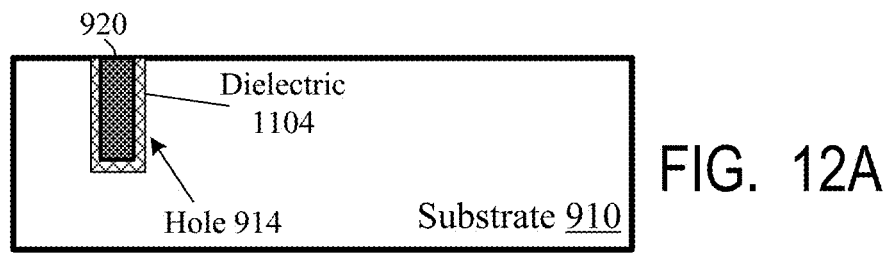

Recessed contact pads can also be made by TSV technology. For example (FIG. 12A), blind vias 920 can be formed as in FIG. 10A; only one via is shown for simplicity, but any number of vias can be formed simultaneously or in sequence. In this example, a layer 1104 lines the holes 914 and separates the substrate 910 from vias 920; layer 1104 is marked as dielectric (e.g. to electrically insulate the vias 920 from the substrate and/or each other); alternatively, or in addition, layer 1104 may function as a barrier layer, or seed layer if conductor 920 was electroplated, and/or may serve other purposes. Layer 1104 is omitted in some embodiments.

Then substrate 910 may optionally be thinned from the bottom by a blanket etch without revealing the blind bias 920. Then (see FIG. 12B) a masked etch of the substrate's bottom surface creates cavities 410 around the bottom ends of vias 920. Dielectric 1120 (FIG. 12C) is deposited on the bottom surface of the structure to protect and electrically insulate the substrate 910 in subsequent processing. Dielectric layers 1104, 1120 initially covered the via 920 on the bottom, but they have been patterned photolithographically to expose the via 920 on the bottom as shown in FIG. 12C. Other layers 1150 (FIG. 12D), shown collectively as a circuit layer, can be formed on the bottom to connect the conductor 920 to appropriate circuitry and to form other circuitry. In FIG. 12C, the layer 1150 covers the via 920 on the bottom but has an exposed conductive surface underlying the via 920 and providing the recessed contact pad 920C. Alternatively or in addition, a recessed contact pad can be provided by some other part of layer 1150 in cavity 410 and/or by via 920.

Then NCF (not shown) can be applied to the bottom surface and processed by any of the techniques described above.

A recessed contact pad can also be formed at the top of via 920. An exemplary process is shown in FIGS. 13A-13E. Cavities 410 (FIG. 13A) are etched by a masked etch at the top of substrate 910. (The terms "top" and "bottom" are for ease of description; the substrate or other elements can be turned upside down or at any angle during fabrication and subsequent operation). Then a mask 1210 (FIG. 13B) is formed to define the holes 914, and the holes are etched at the cavity bottoms. The holes can be blind as shown, or can go through substrate 120. Mask 1210 is removed, and the top surface of substrate 910 is covered by dielectric 1110 (FIG. 13C) and seed layer 1214, possibly with a barrier layer (not shown) below the seed layer. These layers can be patterned as desired; these layers cover the surfaces of holes 914. A mask 1218 (FIG. 13D) is formed to cover the structure but expose the holes 914. Conductor 920, e.g. copper, is electroplated to line or fill the holes 914.

Figure 12D:
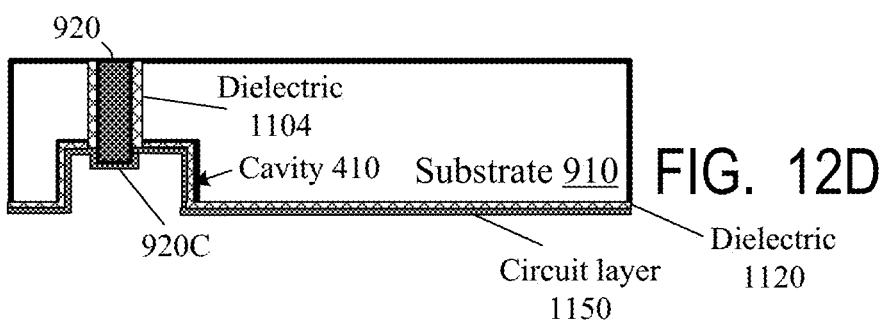
Figure 13A:
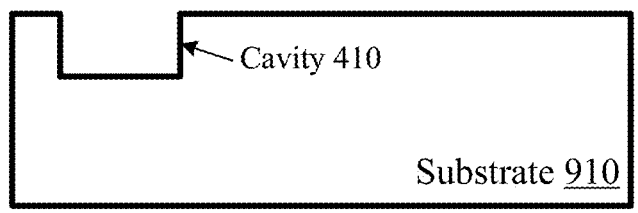
Figure 13B:
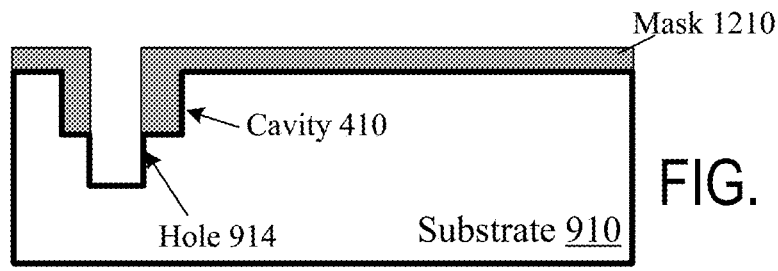
Figure 13C:
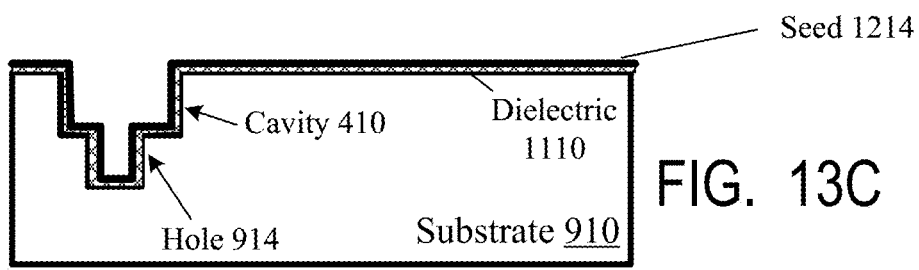
Figure 13D:
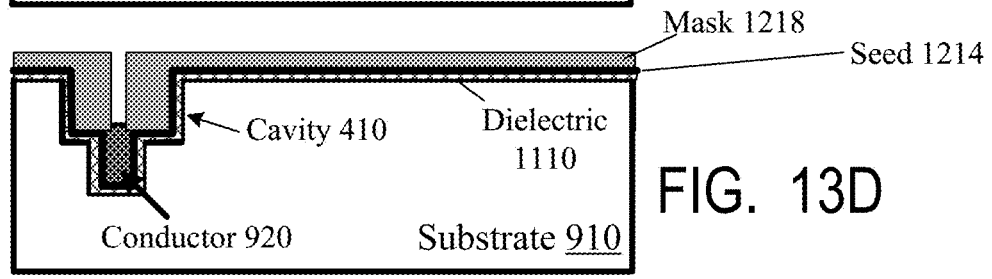
Figure 13E:
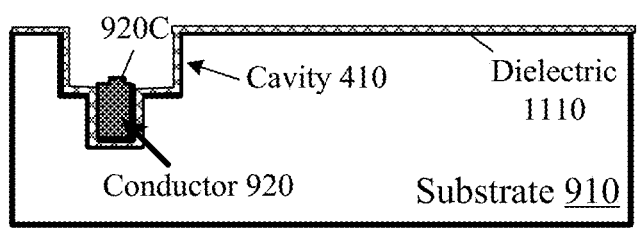
Figure 14A:
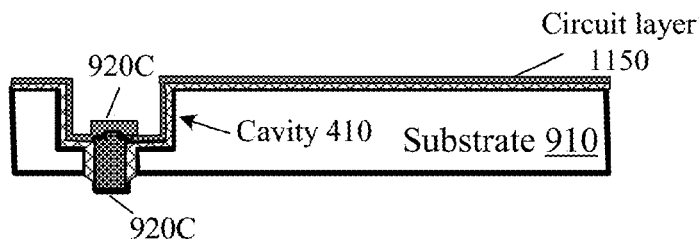
Figure 14B:
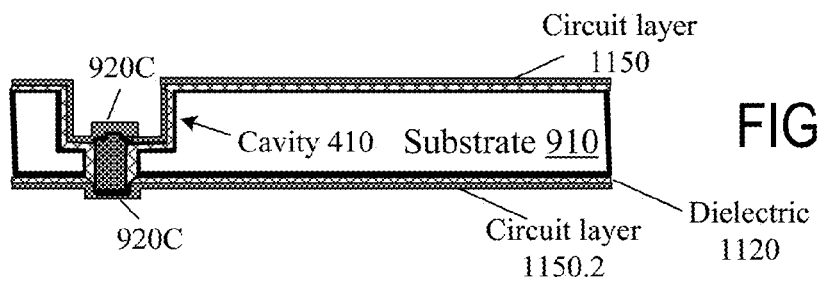

Then mask 1218 is removed (FIG. 13E). The exposed portions of dielectric 1110 and seed 1214 can be removed or patterned as desired. In the embodiment shown, seed 1214 is removed but dielectric 1110 is left in place; dielectric 1110 may cover the surfaces of cavities 410. The recessed contact pad is provided by the top surface of conductor 920. Alternatively (FIG. 3F), a circuit layer 1150 can be formed on top to connect conductor 920 to other elements and provide other circuit elements as in FIG. 12D; in this case, the recessed contact pad can be provided by the circuit layer's portion overlying the conductor 920. Subsequent processing can be as described above. For example, NCF tape can be formed on top. If desired, substrate 120 can be thinned on the bottom to turn conductor 920 into a TSV and provide a recessed or protruding contact pad on the bottom. For example, a protruding contact pad can be provided by a blanket etch as in FIG. 10B. The resulting structure is shown in FIG. 14A; dielectric 1110 is removed at the bottom of via 920 by the blanket or masked etch. If desired, a circuit layer 1150 (FIG. 14B) can be formed on the bottom to connect the TSV 920 to other circuit elements and provide other circuit elements as in FIG. 12D; in this case, the protruding contact pad can be provided by the circuit layer's portion underlying the TSV 920.

Figure 12B:
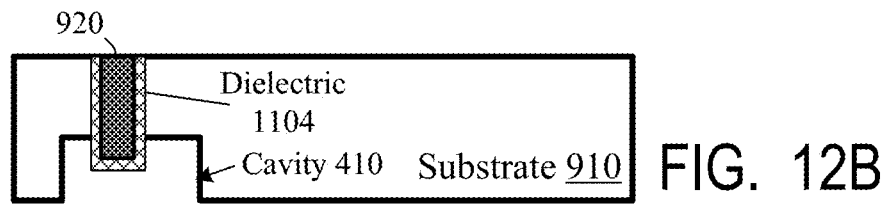
Figure 12C:
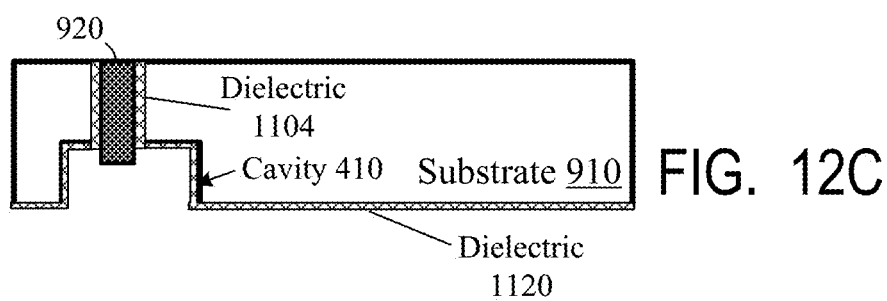
Figure 13F:
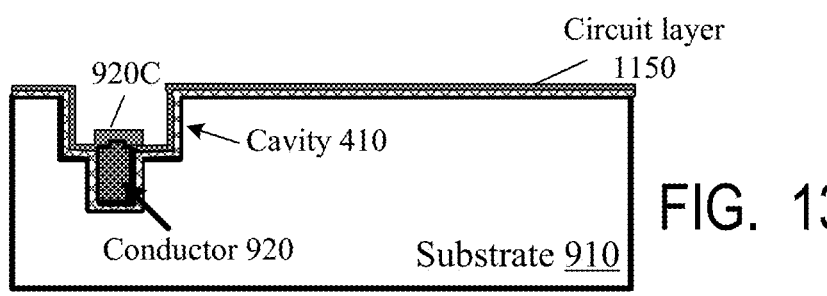
Figure 15:
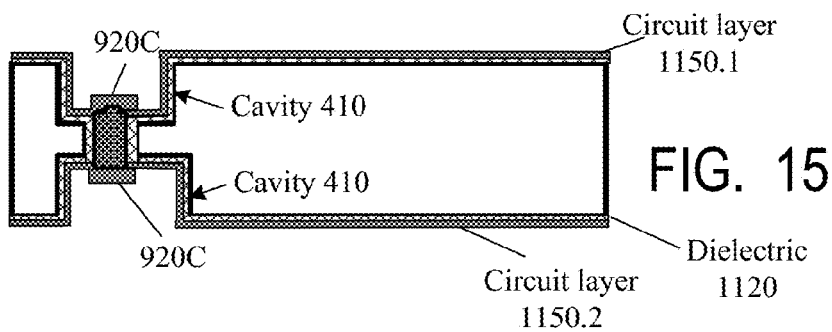

A recessed contact pad on the bottom of the structure of FIG. 13F can be provided by a process of FIGS. 12B-12D; the resulting structure is shown in FIG. 15.

Figure 16:
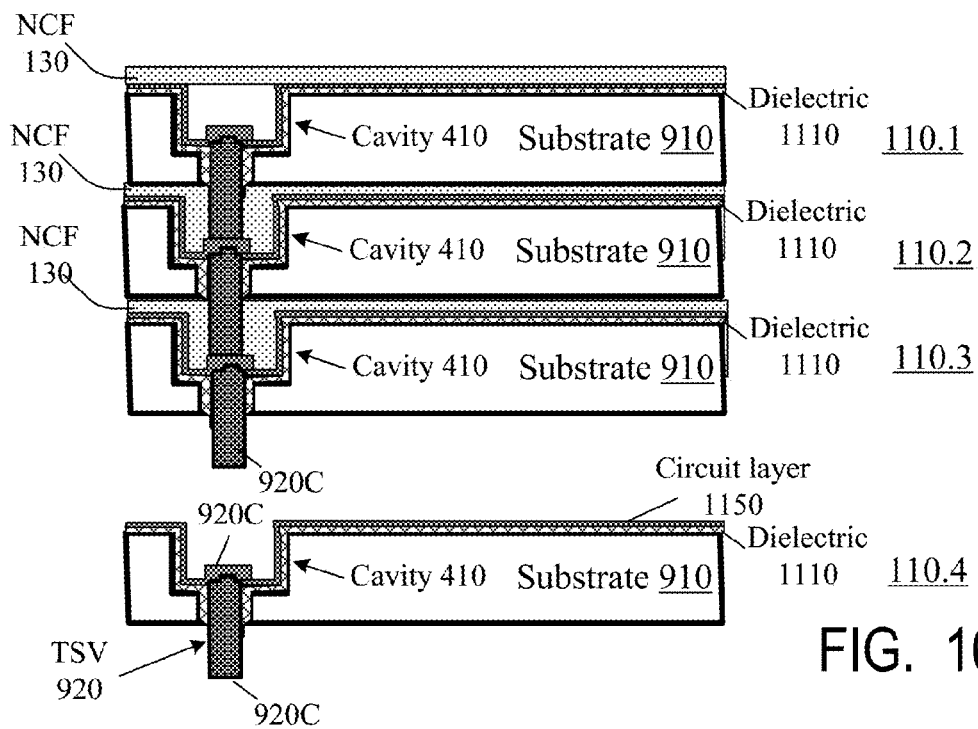

As illustrated in FIG. 16, the TSV technology described above can be used to reduce the height of a microelectronic component that includes a stack of die (such as die 110.1 through 110.4); each die 110 in the middle of the stack has a TSV 920 connected to a TSV 920 of the die above and to another TSV 920 of a die below. The stacked TSVs 920 form a vertical wire that can be connected to each die's circuitry. Examples of such stacks are hybrid memory cubes (see e.g. U.S. pre-grant patent publications 2012/0276733, Saeki et al., Nov. 1, 2012, incorporated herein by reference); routing circuits (U.S. pre-grant patent publication 2014/0111269, Huang et al., Apr. 24, 2014, incorporated herein by reference); and possibly other types. FIG. 16 shows four dies 110.1 through 110.4, with die 110.4 not yet attached to the bottom of the stack. Only one TSV wire is shown, composed of the four TSVs of the four die. Each die's TSV 920 has the structure of FIG. 14, i.e. has a recessed contact pad 920C at the top and a protruding contact pad 920C at the bottom. The top contact pad of each die (except 110.1) is bonded to the bottom contact pad of the overlying die to form the wire. Any number of die can be present in the stack. Only one TSV wire is shown, but any number of TSV wires can be present (e.g. an array of TSV wires can be present). The bottom contact pad of the TSV wire (in the bottom die) can be connected to a PCB or some other substrate (not shown). The top die may or may not have a contact pad at the top of the TSV wire.

If desired, die 110.4 can be attached to the bottom of the stack before it is thinned from the bottom, i.e. at the stage of FIG. 13F (while its via 920 is still a blind via); the die can be thinned from below after the attachment. Each die (other than the top die) can be thinned after the attachment. See U.S. Pat. No. 6,322,903 (Siniaguine et al., Nov. 21, 2001) incorporated herein by reference.

The invention is not limited to the embodiments described above. Other embodiments and variations are within the scope of the invention, as defined by the appended claims.

The invention claimed is:

1. A manufacturing method comprising:
obtaining a first microelectronic component comprising one or more first cavities and, for each first cavity, at least one first contact pad recessed in the first cavity, the first cavity comprising a void above the first contact pad;
attaching an underfill tape to the first microelectronic component, the underfill tape at least partially covering each first cavity's void; and
attaching a second microelectronic component to the first microelectronic component with the underfill tape between the first and second microelectronic components, wherein the second microelectronic component comprises one or more protruding second contact pads, and during the attaching of the second microelectronic component, each second contact pad enters a respective first cavity through the underfill tape and bonds to a respective first contact pad;
wherein during the attaching of the second microelectronic component, at least one second contact pad pushes the underfill tape into the respective first cavity's void and stretches the underfill tape inside the respective first cavity's void.

2. The method of claim 1 wherein the underfill tape is attached so that the underfill tape completely covers at least one first cavity.

3. The method of claim 1 wherein during the attaching of the second microelectronic component, at least one second contact pad creates or enlarges a hole in the underfill tape while the cavity has a void region underlying the second contact pad and the underfill tape.

4. The method of claim 1 wherein each of the first and second microelectronic components comprises a substrate and one or more through-substrate vias (TSV) each of which is a conductive via passing through the substrate;
wherein each protruding second contact pad is provided by a respective TSV in the second microelectronic component or by the second microelectronic component's circuit element underlying the respective TSV; and
wherein each first contact pad is provided by a respective TSV in the first microelectronic component or by the first microelectronic component's circuit element overlying the respective TSV.

5. The method of claim 1 wherein the second microelectronic component comprises one or more first cavities on the side opposite to the one or more protruding second contact pads, and for each first cavity, the second microelectronic component comprises at least one first contact pad recessed in the first cavity, the first cavity comprising a void above the first contact pad;
wherein the method further comprises:
attaching an underfill tape to the second microelectronic component, the underfill tape at least partially covering the void in each first cavity of the second microelectronic component;
obtaining a third microelectronic component comprising one or more protruding second contact pads;
attaching the third microelectronic component to the second microelectronic component, wherein during the attaching of the third microelectronic component, each second contact pad of the third microelectronic component enters a respective first cavity of the second microelectronic component through the underfill tape at least partially covering the void in each first cavity of the second microelectronic component and bonds to a respective first contact pad of the second microelectronic component.

6. The method of claim 1 wherein at least one first cavity comprises fusible material partially filling the first cavity, the first cavity's void comprising a region located directly above the fusible material and directly below the underfill tape.

7. The method of claim 6 wherein the fusible material is provided in the first cavity before attaching the underfill tape.

8. A structure formed by the method of claim 1.

9. The structure of claim 8 further comprising a second microelectronic component attached to the first microelectronic component with the underfill tape disposed between the first and second microelectronic components, wherein the second microelectronic component comprises one or more protruding second contact pads each of which extends into a respective first cavity through the underfill tape and is bonded to a respective first contact pad.

10. The structure of claim 8 wherein each of the first and second microelectronic components comprises a substrate and one or more through-substrate vias (TSVs) each of which is a conductive via passing through the substrate;
wherein each protruding second contact pad is a region of a respective TSV in the second microelectronic component or of the second microelectronic component's circuit element underlying the respective TSV; and
wherein each first contact pad is a region of a respective TSV in the first microelectronic component or of the first microelectronic component's circuit element overlying the respective TSV.

11. The structure of claim 8 wherein the first and second microelectronic components are part of a plurality of at least three microelectronic components M1, M2, . . . , Mn each of which comprises a substrate and one or more through-substrate vias (TSV) each of which is a conductive via passing through the substrate;

wherein the first microelectronic component is one of components M2 through Mn, and the second microelectronic component is one of M1 through Mn−1;

wherein each microelectronic component M2 through Mn comprises one or more first cavities and, for each first cavity, at least one first contact pad recessed in the first cavity, the first cavity comprising a void above the first contact pad;

wherein each microelectronic component M1 through Mn−1 comprises one or more protruding second contact pads;

wherein the method comprises attaching each component Mi (i=1 through n−1) to component Mi+1 with the underfill tape on component Mi+1 being between the components Mi and Mi+1, wherein during the attaching of each component Mi each second contact pad of the component Mi+1 enters a respective first cavity of the component Mi through the underfill tape on component Mi and bonds to a respective first contact pad of component Mi+1.

12. The method of claim 1 wherein the underfill tape comprises a dry tape.

13. The method of claim 1 wherein the underfill tape comprises a combination of dry and liquid layers.

14. The method of claim 1 wherein at a conclusion of the attaching of the underfill tape, said at least one first contact pad is exposed in the void.

15. The method of claim 1 further comprising, before the attaching of the underfill tape, partially filling the cavity by conductive material;

wherein at a conclusion of the attaching of the underfill tape, the conductive material is exposed in the void.

* * * * *